(12) United States Patent
Jakob et al.

(10) Patent No.: US 6,407,336 B1
(45) Date of Patent: Jun. 18, 2002

(54) DEVICE FOR CARRYING HIGH CURRENTS AT A LOW INDUCTANCE, IN PARTICULAR FOR A POWER CONVERTER OR THE LIKE

(75) Inventors: Roland Jakob; Andreas Pelz; Hans-Jürgen Ehler, all of Berlin (DE); David Rudniski, Toronto (CA)

(73) Assignee: Alstom Power Conversion GmbH (DE)

( * ) Notice: Subject to any disclaimer, the term of this patent is extended or adjusted under 35 U.S.C. 154(b) by 0 days.

(21) Appl. No.: 09/474,738

(22) Filed: Dec. 29, 1999

(30) Foreign Application Priority Data

Jan. 1, 1999 (DE) .......................................... 199 03 522

(51) Int. Cl.[7] ................................................ H02G 5/00
(52) U.S. Cl. ............... 174/70 B; 174/99 B; 174/149 B; 174/168; 361/612
(58) Field of Search .............................. 174/70 B, 71 B, 174/72 B, 88 B, 99 B, 149 B, 68.2, 168; 361/279, 326, 612

(56) References Cited

U.S. PATENT DOCUMENTS 5,923,523 A * 7/1999 Herbert .................... 361/306.1
5,936,833 A * 8/1999 Grossman et al. .......... 361/638

* cited by examiner

*Primary Examiner*—Dean A. Reichard
*Assistant Examiner*—W. David Walkenhorst
(74) *Attorney, Agent, or Firm*—Pillsbury Winthrop LLP

(57) ABSTRACT

A device for carrying high currents at a low inductance, in particular for a power converter or the like, is provided with two flat electrical conductors which are arranged roughly parallel to each other and are spaced apart from each other. The space between the two conductors contains no transition from one of the two conductors to a solid-state insulator, and from there to the other of the two conductors. As a result, no aging phenomena can arise in the device according to the invention owing to partial discharges.

7 Claims, 2 Drawing Sheets

DEVICE FOR CARRYING HIGH CURRENTS AT A LOW INDUCTANCE, IN PARTICULAR FOR A POWER CONVERTER OR THE LIKE

CROSS-REFERENCE TO RELATED APPLICATION

This application is related to German Patent Application No. 19903522.9-34 filed Jan. 1, 1999 and incorporated herein by reference.

BACKGROUND OF THE INVENTION

1. Field of the Invention

The invention relates to a device for carrying high currents at a low inductance, in particular for a power converter or the like, with two flat electrical conductors that are spaced apart, roughly parallel to each other and insulated from each other.

2. Background of the Related Art

Such devices are known as bus bar packets and are used to set up inverters with quick-switching power semiconductors. Known bus bar packets have a laminated structure including two copper plates that act as conductors, sandwiched around a plate of film made out of a solid-state insulator. Because the distance between the copper plates is slight, the bus bar packets are suitable for conducting high currents at a low inductance. The solid-state insulator arranged between the copper plates achieves the required dielectric strength of the bus bar packets, e.g., 1 kV.

Due to partial discharges between the copper plates, the solid-state insulator sandwiched between them is subject to aging which diminishes the insulator's dielectric strength. In general, attempts to mitigate this shortcoming by using better and better insulating materials have been made; however, an alternative method of avoiding such aging effects is needed.

SUMMARY OF THE INVENTION

In view of the above problems of the prior art, an object of the present invention is to provide a device for carrying high currents at a low inductance which has a dielectric strength as independent as possible of aging phenomena.

The invention advantageously achieves this object by virtue of the fact that the space between the two conductors has no transition from one of the two conductors to a solid-state insulator, and from there to the other of the two conductors.

According to a first aspect of the present invention, there is no solid-state insulator between the conductors. As a result, no aging phenomena caused by partial discharges can arise in the solid-state insulator. Therefore, a reduction in dielectric strength due to such aging phenomena is also not possible. According to this aspect, the dielectric strength between the conductors is essentially independent of the aging of the materials used. The significant advantage in this is that the device remains finctionally reliable over a longer period of time. Another advantage of this aspect of the invention is that the absence of any solid-state insulator makes it possible to apply significantly higher voltages between the two conductors without this impairing the functional capacity of the device.

It is particularly advantageous for the space between the conductors to contain a non-solid, insulating medium, preferably air. If partial discharges now take place between the conductors of the device, they will not result in damage to the non-solid, insulating medium sandwiched in between them. At the same time, however, the insulating medium achieves the required insulation between the two conductors in a simple manner.

In particular, the use of air as an insulator brings with it the significant advantage that a high dielectric strength can be reached via the appropriate selection of distance between the two conductors on the one hand, and that the outlay and resultant costs for this device are especially low on the other.

According to another aspect of the present invention, the space between the two conductors is formed by the conductor surfaces created by the two conductors, and by the connecting surfaces created between the edges of the two conductors. This ensures that the area impacted by the voltage present between the two conductors contains no material from a solid-state insulator. Instead, this area preferably contains only air. Therefore, no aging phenomena in insulating materials can arise in this endangered area, which produces the already-mentioned advantages.

According to a further aspect of the present invention, the two conductors are held in a mount on their surfaces facing away from each other. Therefore, the mounts are not present in the aforementioned endangered area. As a result, the mounts, which preferably consist of an insulating material, are not subjected to any aging due to partial discharges. The mounts hence exhibit a guaranteed functional reliability over a long period of time to go along with the already-mentioned advantages.

In a further aspect of the present invention, the two conductors are linked together outside the space present between them by two connections. The connections are therefore not arranged in the aforementioned endangered area. Since the insulation clearance of these insulating connections is independent of the distance between the conductors, and hence can be sufficiently large given a low inductance, aging phenomena in the connections owing to partial discharges are essentially precluded.

It is particularly advantageous for the mounts to be secured to the connections. This especially easy and effective step yields a structurally stable and yet inexpensive design of the device.

According to yet another aspect of the present invention, the two conductors are staggered relative to each other. This makes it possible to lengthen the insulation clearances that arise between the two conductors via the mounts and connections. The dielectric strength of the device according to the invention can therefore be further improved without any greater outlay.

According to a still further aspect of the present invention, one of the two conductors is provided with a solid-state insulator on its surface facing the other of the two conductors. This gives rise to a transition between one of the two conductors and the solid-state insulator. Another transition from the solid-state insulator to the other of the two conductors is not present, however. Instead, the non-solid, insulating medium, preferably air, is present there. The solid-state insulator is not used primarily for building up the dielectric strength between the two conductors. This continues to be achieved primarily by the non-solid insulating medium. The solid-state insulator essentially acts only to avoid a short circuit between the two conductors, e.g., if a metal part gets between the conductors. Since the solid-state insulator hence has no influence on dielectric strength, partial discharges in the solid-state insulator also do not have any negative consequences in terms of this dielectric strength. Therefore, the solid-state insulator provides simple and cost-effective protection against a possible short circuit between the two connectors.

According to another aspect of the present invention, the space between the two conductors is enveloped by a protective screen or the like and/or viewable from the outside for inspection purposes. This makes it possible to prevent a short circuit between the two conductors in a particularly easy and cost-effective but yet effective manner.

BRIEF DESCRIPTION OF THE DRAWINGS

Additional features, possible applications and advantages to the invention arise from the following description of embodiments of the invention, which are shown in the drawings. In this case, all described or depicted features, taken separately or in any combination, comprise the subject matter of the invention, regardless of how they are summarized in the claims or cross-referenced, and regardless of how they are formulated or depicted in the description or drawings.

DETAILED DESCRIPTION OF PRESENTLY PREFERRED EXEMPLARY EMBODIMENTS

Figure 1:
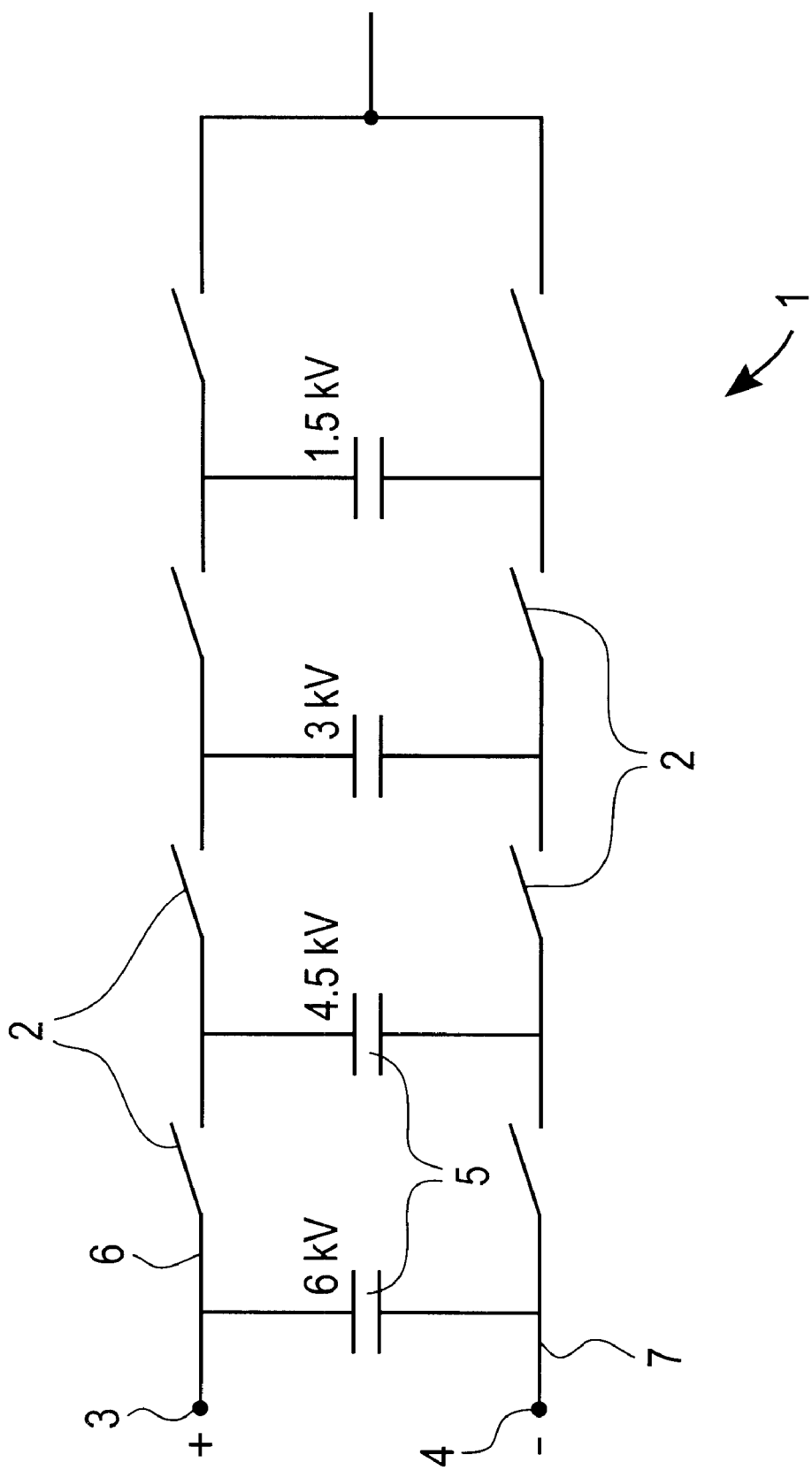
FIG. 1 shows a schematic view of a circuit arrangement which can accommodate a device according to the present invention for carrying high currents at a low inductance.

FIG. 1 shows a schematic view of an inverter 1 that is provided with quick-switching and high-blocking capacity power semiconductors 2, for example, with insulated gate bipolar transistors (IGBTs). The inverter 1 is provided with a plus pole 3 and a minus pole 4, between which capacitors 5 are present. For example, if a voltage of 6 kV is applied between the plus and minus poles 3, 4, this voltage is broken down to the capacitors 5 via switches 2. A voltage of 6000 kV is then present on the capacitor 5 directly adjacent to the plus and minus poles 3, 4, a voltage of 4500 kV is on the next capacitor 5, a voltage of 3000 kV is on the following capacitor 5, and a voltage of 1500 kV is on the last of the capacitor 5 shown in FIG. 1.

A string of conductors 6 connected to the plus pole 3 constitutes the upper layer 9 of a bus bar packet 8 (see FIG. 2), and a string of conductors 7 connected to the minus pole 4 constitutes the lower layer 10 of the bus bar packet 8. The switches 2 and capacitors 5 shown in FIG. 1 are electrically connected with these layers of the bus bar packet 8.

The upper and lower layers 9, 10 of the bus bar packet 8 are comprised of flat conductors 11, 12 arranged parallel to each other and at a distance from each other. The upper and lower layers 9, 10 are also insulated from each other. As a result, the upper and lower layers 9, 10 are suitable for carrying high currents at low inductances. Therefore, the bus bar packet 8 is a device for carrying high currents at a low inductance that can be used in a converter such as the one shown in FIG. 1 or the like.

As noted above, FIG. 2 shows a device 8 that constitutes such a bus bar packet. The device 8 in FIG. 2 can be used to realize the strings of conductors 6, 7 in FIG. 1, in particular right next to the plus and minus poles 3, 4 in FIG. 1, thus providing 6000 kV at the capacitor 5 shown in FIG. 1. Specific arrangements for electrically connecting the device 8 in the circuit of FIG. 1 will be readily apparent to those skilled in the art and will not be described herein for simplicity and ease of explanation.

Figure 2:
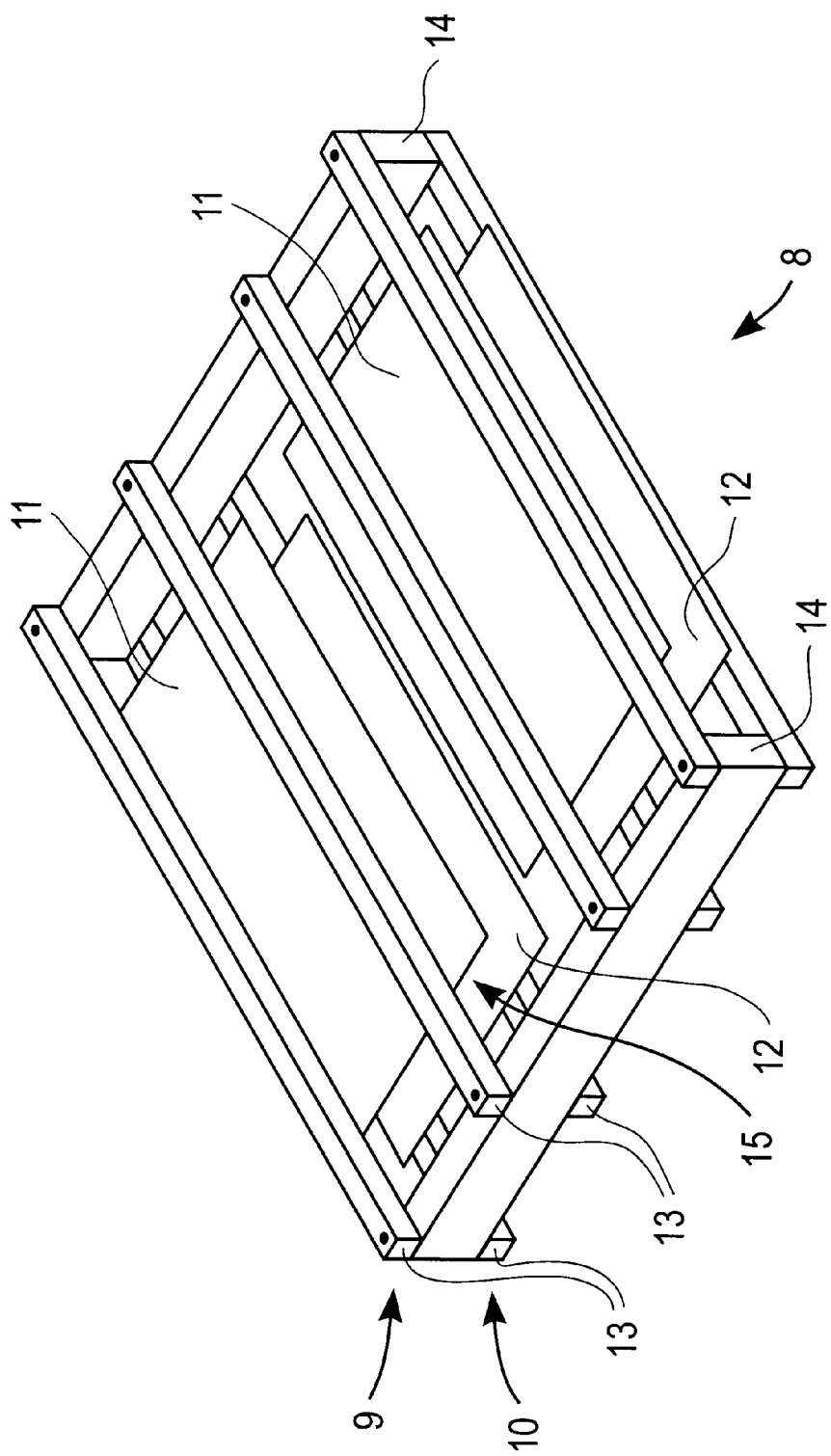
FIG. 2 shows a perspective view of an embodiment of a device according to the present invention.

The device 8 in FIG. 2 has an upper layer 9 and lower layer 10, in which two flat electrical conductors 11, 12 each are arranged. Conductors 11, 12 can be copper plates or the like. The conductors 11 of the upper layer 9 and conductors 12 of the lower layer 10 are arranged roughly parallel to each other and are spaced apart from each other. The conductors 11, 12 are essentially flat in design.

The surfaces of conductors 11, 12 facing away from each other are provided with mounts 13 which take the form of, for example, straight braces, and which project over the surfaces formed by the conductors 11, 12. The mounts 13 are made out of an insulating material, and are rigidly connected with the conductors 11, 12. Each of the conductors 11, 12 are provided with, for example, two roughly parallel mounts 13.

The four mounts 13 present in one of the two layers 9, 10 are linked together via a connection 14 consisting of a straight brace, for example. To this end, two roughly parallel connections 14 are provided for linking the mounts 13 of the upper layer 9 with the mounts 13 of the lower layer 9. These connections 14 are preferably made out of an insulating material, and are rigidly connected with the mounts 13. The connections between the mounts 13 and connections 14 are provided outside the surfaces formed by the conductors 11, 12, i.e., in the projecting area of the mounts 13.

One of the two conductors 11 in the top layer 9 and the opposing conductor 12 in the lower layer 10 belonging to this conductor 11 will now be examined. Situated between these two conductors 11, 12 is a space 15 that is defined by the conductor surfaces of the two conductors 11, 12, as well as by the connecting surfaces between the edges of the two conductors 11, 12.

As is evident from FIG. 2, this space 15 has no transition from one of the two conductors 11, 12 to a solid-state insulator, and from this solid-state insulator to the other of the two conductors 11, 12. Instead, only air is present in this space 15. This space 15 can also have another non-solid insulating medium in place of air. As is also evident from FIG. 2, the space 15 has none of the mounts 13 or connections 14. These mounts 13 and connections 14 are all situated outside the space 15.

As explained above, the conductors 11, 12 of the upper and lower layers 9, 10 are electrically insulated from each other by the space 15 filled with air and by the mounts 13 and connections 14 made out of insulating material. Since the space 15 contains no solid-state insulator, no partial discharge can come about in such a solid-state insulator. Therefore, the space 15 filled with air between the conductors 11, 12 represents an essentially aging-free insulation between the two conductors 11, 12.

The mounts 13 and connections 14 are arranged outside the space 15. The insulation clearance can hence be dimensioned to reflect the required partial discharge strength, regardless of the distance between the two conductors 11, 12. In this regard as well, the insulation between the two conductors 11, 12 can essentially not be diminished due to aging factors.

The selected distance between the two conductors 11, 12 can influence the dielectric strength between the two conductors 11, 12. This dielectric strength can also be influenced by a corresponding design of the mounts 13 and connections 14, in particular by the formation of as long an insulation clearance as possible over the mounts 13 and connections 14. This insulation clearance between the two conductors 11, 12 over the mounts 13 and connections 14 can be lengthened by staggering the conductors 11 of the upper layer 9 relative to the conductors 12 of the lower layer 10.

It is possible that a short circuit might arise between the two conductors 11, 12, e.g., if an electrically conductive object inadvertently gets between the two conductors 11, 12, e.g., a metal part. To prevent such a short circuit, one of the two conductors 11, 12 can be provided with a solid-state insulator on its surface facing the other conductor, preferably with an insulating film or the like. In this case, a transition is established between one of the two conductors 11, 12 and the insulating film. The other of the two conductors 11, 12 has no direct transition to the insulating film, however. As already explained, air or some other non-solid, insulating medium is present between this other of the two conductors 11, 12 and the insulating film.

The insulating film is designed in such a way as to have a dielectric strength reflecting the voltage present between the two conductors 11, 12. As a result, partial discharges arise in the insulating film only if a metal part gets between the conductors 11, 12. However, a short circuit does not take place due to the dielectric strength of the insulating film.

To prevent the insulating film from becoming damaged by a partial discharge during normal operation, meaning without a metal part between the conductors 11, 12, the air insulation and insulating film dimensions along with the dielectric constant of the insulating film can be selected in such a way that the voltage stress of the insulating film becomes smaller than the partial discharge intermittent voltage.

Another way to protect the two conductors 11, 12 against a short circuit due to metal parts sandwiched between them can be to have the space 15 between the two conductors 11, 12 be enveloped by a protective screen or the like. Another alternative or additional way to prevent a short circuit or at least detect it early can be to have the space 15 between the two conductors 11, 12 be visible from the outside for inspection purposes.

The present invention has been described above in connection with a preferred embodiment thereof; however, this has been done for purposes of illustration only, and the invention is not so limited. Indeed, variations of the invention will be readily apparent to those skilled in the art and also fall within the scope of the invention.

What is claimed is:

1. A device for carrying high currents at a low inductance for a power converter, comprising:

two planar electrical conductors that are spaced apart, roughly parallel to each other and insulated from each other;

spacing means for establishing the space between the two conductors, said spacing means formed by the two conductors, wherein the spacing means contains a non-solid insulating medium, preferably air, and further wherein the spacing means contains no transition from one of the two conductors to a solid-state insulator, and from there to the second of the two conductors; and connecting means, formed between the edges of the two conductors, wherein the conductors are connected by said connecting means, said connecting means consisting of two connectors situated on the opposite sides of the two conductors outside the spacing means.

2. A device according to claim 1 wherein the two conductors are each supported on their surfaces facing away from the other conductor by at least one mounting.

3. A device according to claim 2 wherein said at one mounting is secured by said connecting means.

4. A device according to claim 1 wherein the two conductors are mounted offset with respect to each other.

5. The device according to claim 1, wherein the second one of the two conductors has a solid-state insulator on its side facing the first one of the two conductors.

6. The device according to claim 1, further comprising a protective screen enveloping the space between the two conductors.

7. The device according to claim 1, wherein the space between the two conductors is viewable from outside for inspection purposes.

* * * * *